US007390202B2

(12) United States Patent  (10) Patent No.: US 7,390,202 B2
Ma et al.  (45) Date of Patent: Jun. 24, 2008

(54) ELECTRICAL CONNECTOR ASSEMBLY WITH PICK UP CAP

(75) Inventors: Hao-Yun Ma, Tu-Cheng (TW); Guo-He Yu, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/825,888

(22) Filed: Jul. 9, 2007

(65) Prior Publication Data

US 2008/0009158 A1  Jan. 10, 2008

(51) Int. Cl.
H01R 13/44 (2006.01)
(52) U.S. Cl. ..................................................... 439/135
(58) Field of Classification Search ................. 439/135, 439/940, 941, 331
See application file for complete search history.

(56) References Cited

U.S. PATENT DOCUMENTS 6,561,825 B1 * 5/2003 McHugh et al. ............. 439/135
7,090,517 B2 * 8/2006 Ma .............................. 439/135
7,140,890 B1 * 11/2006 Ju ................................ 439/135
7,147,508 B1 * 12/2006 Ju ................................ 439/521

* cited by examiner

*Primary Examiner*—Phuong K Dinh
(74) *Attorney, Agent, or Firm*—Wei Te Chung

(57) ABSTRACT

An electrical connector assembly includes an electrical connector and a pick up cap. The connector includes an insulative housing, a plurality of contacts received in the housing, a stiffener being able to support and secure the housing, and a metal clip. The housing defines a conduction region for supporting a central processing unit (CPU). The clip is disposed on the housing to press the CPU upon the contacts. The pick up cap provides a smooth flat portion facilitating to be sucked by a vacuum suction device, thereby manipulating the electrical connector assembly on a desire location of a substrate circuit such as a printed circuit board (PCB). The pick up cap attaches to the stiffener, and the pick up cap covers at least a portion of the clip. Thus, user must take away the pick up cap before mounted the CPU to the connector.

2 Claims, 4 Drawing Sheets

ELECTRICAL CONNECTOR ASSEMBLY WITH PICK UP CAP

BACKGROUND OF THE INVENTION

1. Field of the Invention

The present invention relates to an electrical connector assembly which comprises an electrical connector and a pick up cap, and more particularly to an electrical connector assembly comprising an electrical connector with a pick up cap, which the pick up cap must be took away before an electrical package is mounted to the connector.

2. Description of the Prior Art

On many production lines, electronic components such as land grid array (LGA) connectors are accurately positioned on substrate circuits such as printed circuit boards (PCBs) by means of vacuum suction devices. Such an LGA connector typically comprises an insulative housing, a plurality of electrical contacts received in the housing, a metal clip pivotably mounted to an end of the housing, and a lever pivotably mounted to opposite end of the housing for engaging with the clip. The clip has a generally rectangular window in middle thereof. Each contact has a first contact portion protruding outwardly from a top portion of the housing, for electrically connecting with a multiplicity of metal contact pads of an LGA central processing unit (CPU) respectively. Thus, a pick up cap has to be pre-attached on the top portion of the housing. The pick up cap typically has a plurality of latches snapping corresponding sidewalls of the housing, thereby mounting the pick up cap onto the LGA connector. The pick up cap has a smooth flat top surface exposing from the window. The vacuum suction device is then able to engage on the flat top surface of the pick up cap, in order to reliably move and accurately position the LGA connector onto the PCB.

Furthermore, the U.S. Pat. No. 6,877,990 disclosed an LGA connector assembly including an LGA connector and a pick up cap. The connector includes an insulative housing, a plurality of contacts received in the housing, and a metal clip. The housing defines a cavity for receiving an LGA central processing unit (CPU) therein. The clip is disposed on the housing to press the CPU upon the contacts. The pick up cap is generally rectangular, and has a plurality of clasps at two opposite ends thereof. The clasps snap edges of the clip of the connector to securely mount the pick up cap onto the connector. The pick up cap provides a smooth flat portion facilitating to be sucked by a vacuum suction device, thereby manipulating the LGA connector assembly on a desire location of a substrate circuit such as a printed circuit board (PCB). However, the pick up cap is disposed on the metal clip and the clasps attached with the metal clip, so while the CPU is inserted into the cavity of the housing, it may be forgot to move the pick up and so caused a wrong operation.

Therefore, a new electrical connector assembly with pick up cap that overcome above-mentioned disadvantages is desired.

SUMMARY OF THE INVENTION

Accordingly, an object of the present invention is provision of an electrical connector assembly which has an electrical connector and a pick up cap mounted on the connector, wherein the electrical connector assembly is provided to avoid causing wrong operation while the CPU is inserted into the housing and has no risk of damaging the contacts during attachment of the pick up cap onto the connector or detachment of the pick up cap from the connector.

To achieve the above-mentioned object, an electrical connector assembly in accordance with a preferred embodiment includes an electrical connector and a pick up cap. The connector includes an insulative housing, a plurality of contacts received in the housing, a stiffener being able to support and secure the housing, and a metal clip. The housing defines a conduction region for supporting a central processing unit (CPU). The clip is disposed on the housing to press the CPU upon the contacts. The pick up cap provides a smooth flat portion facilitating to be sucked by a vacuum suction device, thereby manipulating the electrical connector assembly on a desire location of a substrate circuit such as a printed circuit board (PCB). The pick up cap attaches to the stiffener, and the pick up cap covers at least a portion of the clip. Thus, user must take away the pick up cap before mounted the CPU to the connector.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
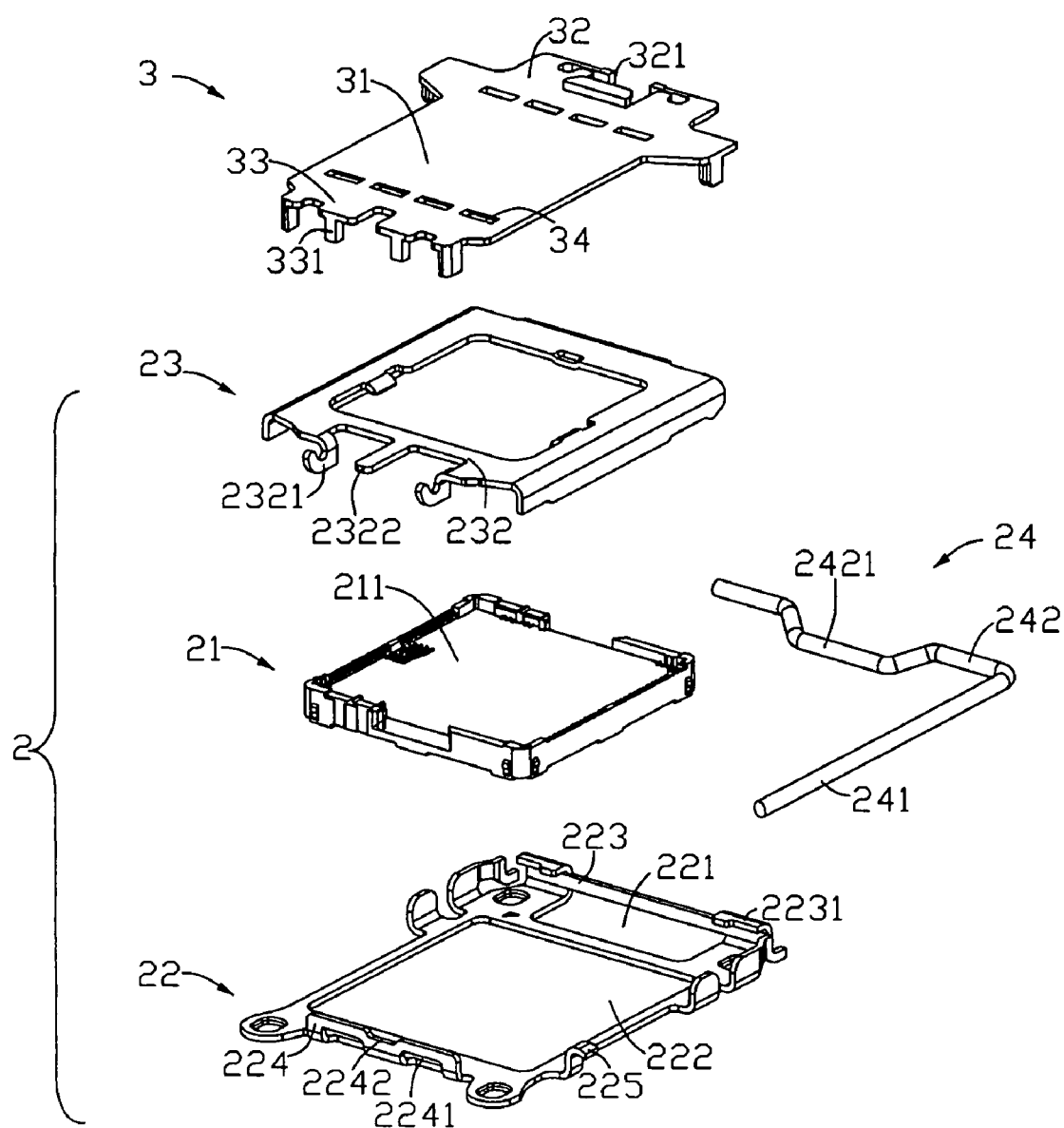
FIG. 1 is an exploded, isometric view of an electrical connector assembly of the present invention; the electrical connector assembly has an electrical connector and a pick up cap.
Figure 2:
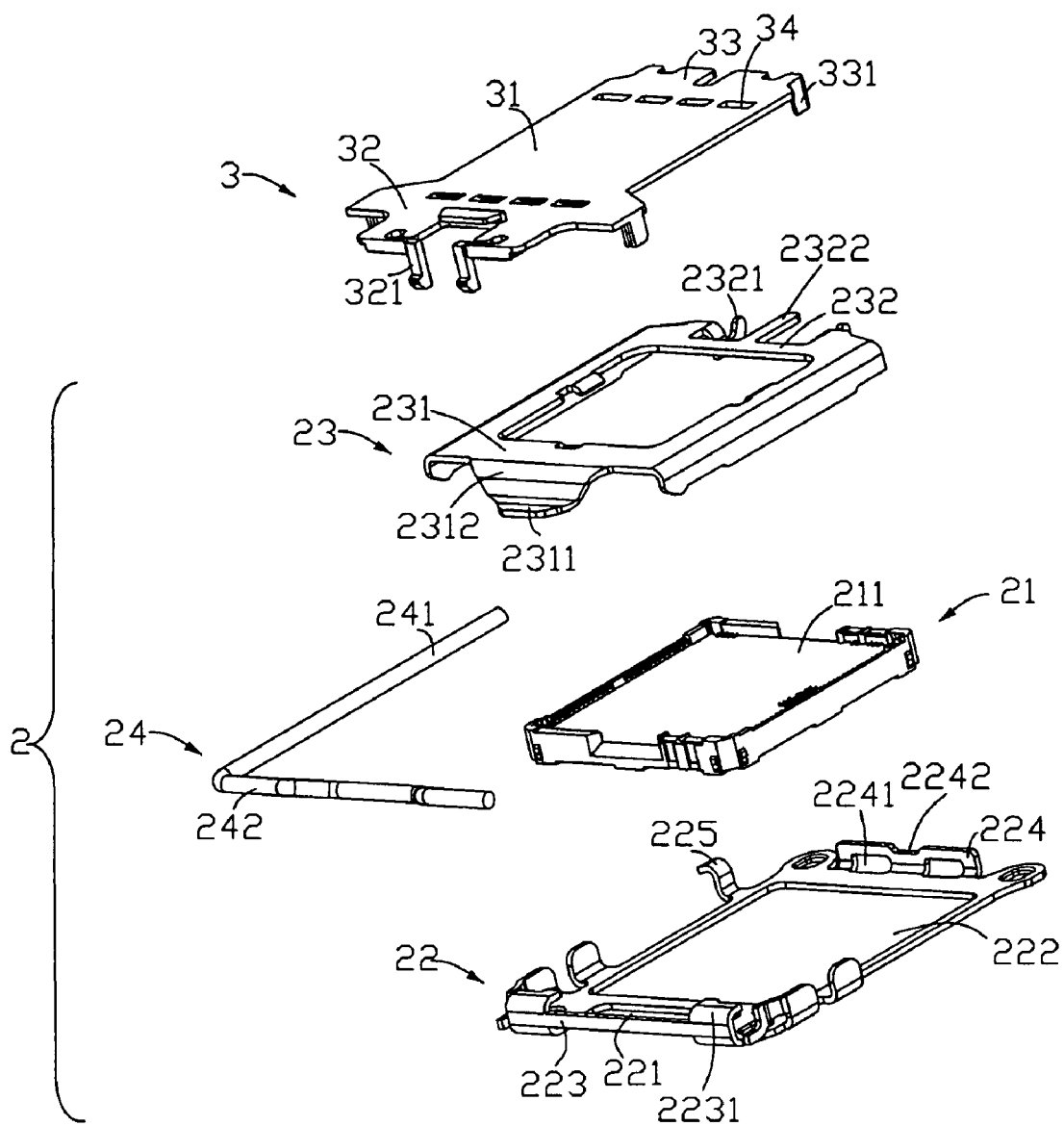
FIG. 2 is an isometric view similar to the FIG. 1, but from another perspective.
Figure 3:
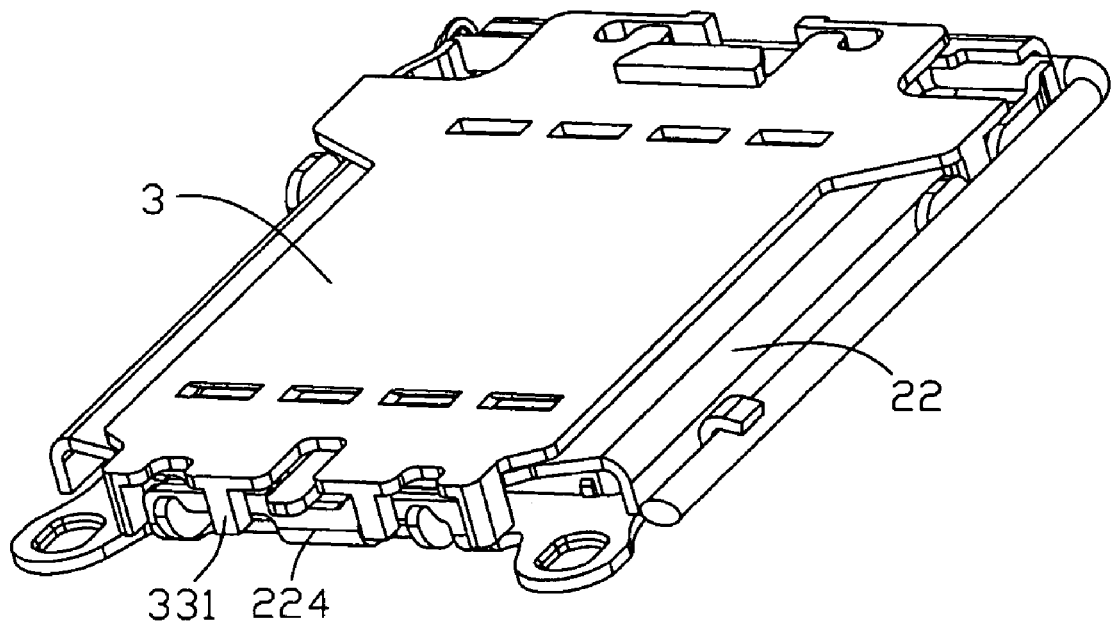
FIG. 3 is an assembled view of FIG. 1, the pick up cap mounted onto the connector.
Figure 4:
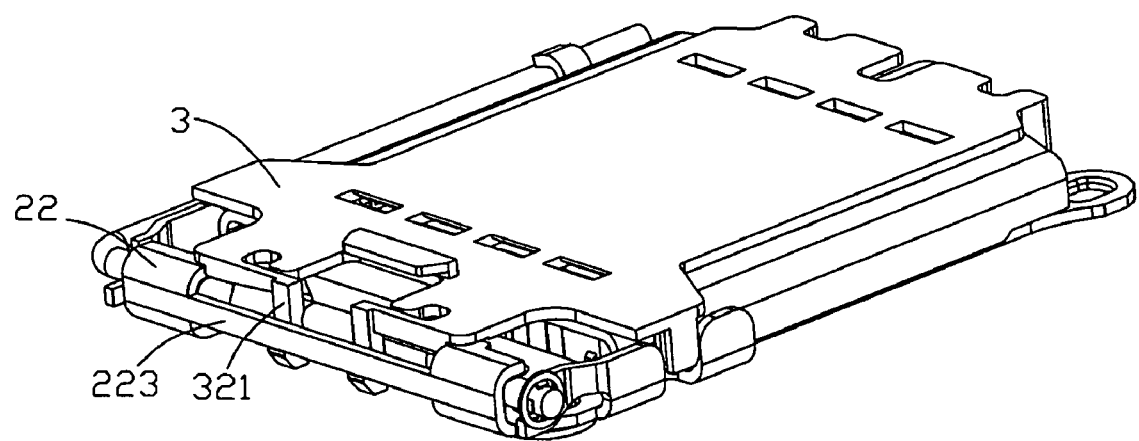
FIG. 4 is an assembled view similar to FIG. 3, but from another perspective.

FIGS. 1-2 show an exploded, isometric view of an electrical connector assembly in accordance with a preferred embodiment of the present invention. The electrical connector assembly comprises an electrical connector 2, which is used for electrically connecting an electronic package, such as a central processing unit (CPU) to a printed circuit board (PCB), and a pick up cap 3. The pick up cap 3 is mounted to the connector 2 for provision of a smooth flat pick-up portion 31 facilitating to be sucked by a vacuum suction device (not shown), thereby manipulating the electrical connector 2 onto a substrate circuit, such as a printed circuit board (PCB) (not shown), where the connector 2 is seated.

The electrical connector 2 comprises a generally rectangular insulative housing 21, a plurality of electrical contacts (not shown) receiving in the housing 21, a metal stiffener 22 partly covering the housing 21 to enforce the housing 21, a lever 24 pivotably received in an end of the stiffener 23, and a metal clip 23 pivotably mounted to an opposite end of the stiffener 22 for engaging with the lever 24.

Now referring to FIGS. 1-4, the housing 21 defines a generally rectangular conduction region 211 for supporting a CPU in middle thereof, which has a number of passageways (not shown), and a number of electrical contacts receiving therein, respectively.

The metal clip 23 pivotally mounted to an opposite end of the stiffener 22 comprises a first lateral side 231 and a second lateral side 232. The first side 231 defines an engaging portion 2311 having an engaging surface 2312. A pair of retention portions 2321 extends symmetrically from the second lateral side 232, a positioning portion 2322 disposed therebetween. The stiffener 22 is formed from a high strength material and is of a longwise configuring and defines a first opening 221 and a second opening 222 at a bottom portion. A supporting area (not labeled) is formed around the two openings for carrying the housing 21. One end in a lengthways direction of the stiffener 22 defines a first holding wall 223 extending vertically from lateral side of the first opening 221, a second holding wall 224 extending vertically from the opposite end of the stiffener 22. A pair of clasps 2231 extends symmetrically from two ends of the first holding wall 223 towards the openings. The second holding wall 224 defines a pair of notches 2241, and a positioning nick 2242 formed therebetween. The notches 2241 are used for engaging with the retention portions 2321 of the clip 23, and the positioning nick 2242 is used for engaging with the positioning portion 2322. Two ends of the stiffener 22 having the first and second holding wall are called foreside and rearward, respectively. The stiffener 22 has a curving hook 225 and a plurality of supporting walls (not labeled) extending form two opposite sides of the stiffener 22, wherein the curving hook 225 is disposed at one side of the stiffener 22 near the rearward of the stiffener 22 and extends aloof from the openings of the stiffener 22. The first and the second holding define a receiving cavity together with the supporting walls.

Referring to FIGS. 1-2, we can see, the lever 24 including a urging portion 241, and an operating portion 242 having a pressing portion 2421. The pick up cap 3 having a roughly plate configuration comprises a smooth flat picking-up portion 31 facilitating to be sucked by a vacuum suction device, a foreside 32 and a backside 33 disposed at opposite sides of the picking-up portion 31. The pick up cap 3 has a plurality of slots 34 for dissipating heat. A pair of first clasps 321 extends from the foreside 32 and a number of second clasps 331 extend from the backside 33.

An assembling process will be detailedly described hereunder referring to FIGS. 1-4 in accordance with the present invention. Firstly, the housing 21 is placed in the receiving cavity of the stiffener 22, the clip 23 and the lever 24 mounted onto the opposite ends of the stiffener 22. The retention portion 2321 of the clip 23 engages with the notch 2241, and the positioning portion 2322 of the clip 23 engages with the positioning nick 2242. The clip 23 can turn from an open position to a close position around the rearward of the stiffener 22. The urging portion 241 of the lever 24 engages with the retention portion 2321, and meanwhile, the pressing portion 242 presses on the engaging portion 2311 of the clip 23, thus the clip 23 in the close portion and secured by the lever 24. After the connector 2 is assembled, in attaching of the pick up cap 3 onto the connector 2, the pick up cap 3 is disposed over the clip 23, with the first clasps 321 engaging with the first holding wall 223 of the stiffener 22 and some second clasps 331 engaging with the notch 2241 of the stiffener 22. The first clasps 321 and the second clasps 331 are far away from the electrical contact that received in the housing 21, thereby avoid bumping the contacts. In this position, a vacuum suction device (not shown) can suck the pick-up portion 31 of the pick up cap 3 in order to move the connector assembly to a desired location on the PCB.

After the connector assembly is mounted onto the PCB, a CPU will be inserted into the housing 21 of the connector 2. Because the foreside 32 and the backside 33 of the pick up cap 3 are attached with the stiffener 22, so user must take away the pick up cap 3 before mounted the CPU to the connector 2 and ensure to avoid wrong operation.

Although the present invention has been described with reference to a particular embodiment, it is not to be construed as being limited thereto. Various alterations and modifications can be made to the embodiment without in any way departing from the scope or spirit of the present invention as defined in the appended claims. For instance, in another preferred embodiment of the present invention, the first clasps 321 could engage with the first holding wall 223 of the stiffener 22 and the second clasps 331 engage with the clip 23. Of course, the configuration of the second clasps 331 and the clip 23 must be made some modifications to accommodate with this new design. In such a case, the user also must take away the pick up cap 3 before mounted the CPU to the connector 2.

What is claimed is:

1. An electrical connector assembly, comprising:
an insulative housing, the housing defining a conduction region for supporting an electronic package therein;
a plurality of electrical contacts received in the conduction region;
a metallic stiffener being able to support and secure the housing, the stiffener defining a supporting area for receiving and holding the housing;
a metal clip disposed on the housing to press the electronic package upon the contacts; and
a pick up cap attached to the stiffener and covering at least a portion of the clip further comprising a lever pivotally received in an end of the stiffener; wherein the clip is pivotally mounted on opposite end of the stiffener for engaging with the lever; wherein the pick up cap has a front end and a rear end, wherein at least one of the rear end and the front end attached to the stiffener; wherein both front end and the rear end are fastened to the stiffener.

2. An electrical connector assembly comprising: an insulative housing, the housing defining a conduction region for supporting an electronic package therein; a plurality of electrical contacts received in the conduction region; a metallic stiffener being able to support and secure the housing, the stiffener defining a supporting area for receiving and holding the housing; a metal clip disposed on the housing to press the electronic package upon the contacts; and a pick up cap attached to the stiffener and covering at least a portion of the clip further comprising a lever pivotally received in an end of the stiffener, wherein the clip is pivotally mounted on an opposite end of the stiffener for engaging with the lever; wherein the pick up cap has a front end and a rear end, wherein at least one of the rear end and the front end is attached to the stiffener; wherein the front end of the pick up cap is attacked with the stiffener and the rear end of the pick up cap is attached with the clip.

* * * * *